(12) United States Patent
Abe

(10) Patent No.: US 7,763,899 B2
(45) Date of Patent: Jul. 27, 2010

(54) ELECTRO-OPTICAL DEVICE AND ELECTRONIC APPARATUS HAVING A PLURALITY OF PIXEL SECTIONS DISPOSED IN A STAGGERED MANNER

(75) Inventor: Daisuke Abe, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 185 days.

(21) Appl. No.: 11/461,978

(22) Filed: Aug. 2, 2006

(65) Prior Publication Data

US 2007/0035241 A1    Feb. 15, 2007

(30) Foreign Application Priority Data

Aug. 9, 2005    (JP) ............... 2005-231345

(51) Int. Cl.
  *H01L 33/00*    (2010.01)
(52) U.S. Cl. ............... 257/88; 257/59; 257/E27.131; 257/E27.152; 348/315
(58) Field of Classification Search ............ 257/59, 257/88–89, 98–99, 678, 40, 82, E27.131, 257/E27.132, E27.135, E27.138, E27.152, 257/E51.022; 348/294, 302, 315, 332; 349/44, 349/144, 146
See application file for complete search history.

(56) References Cited

U.S. PATENT DOCUMENTS 6,281,634 B1    8/2001    Yokoyama
6,429,599 B1    8/2002    Yokoyama
6,433,486 B1    8/2002    Yokoyama
6,690,118 B2    2/2004    Yokoyama
6,995,517 B2    2/2006    Yokoyama
7,148,944 B2 *    12/2006    Kinoshita et al. ........... 349/158
7,279,715 B2 *    10/2007    Park et al. ..................... 257/79
2004/0130514 A1    7/2004    Yokoyama
2005/0017268 A1    1/2005    Tsukamoto et al.
2006/0197461 A1    9/2006    Yokoyama

FOREIGN PATENT DOCUMENTS

| JP | A-11-003048 | 1/1999 |
| JP | A 2005-109406 | 4/2005 |
| KR | A 2000-47778 | 7/2000 |
| KR | A 2004-15507 | 2/2004 |
| WO | WO 03/023745 A1 | 3/2003 |

* cited by examiner

*Primary Examiner*—Davienne Monbleau
*Assistant Examiner*—Dilinh P Nguyen
(74) *Attorney, Agent, or Firm*—Oliff & Berridge, PLC

(57) ABSTRACT

An electro-optical device provided with a plurality of pixel sections, includes: a first substrate having a plurality of light-emitting elements to configure the plurality of pixel sections; a second substrate having a driving circuit to control light emission of the plurality of light-emitting elements, respectively, and disposed so as to face an element forming surface of the first substrate; and a plurality of conductive connectors provided between the first substrate and the second substrate, and electrically connect the plurality of light-emitting elements, respectively, to the driving circuit. The plurality of conductive connectors are disposed in a staggered manner at least along a first arrangement direction of the plurality of pixel sections.

7 Claims, 5 Drawing Sheets

ELECTRO-OPTICAL DEVICE AND ELECTRONIC APPARATUS HAVING A PLURALITY OF PIXEL SECTIONS DISPOSED IN A STAGGERED MANNER

BACKGROUND OF THE INVENTION

Technical Field

The present invention relates to an electro-optical device provided with a pixel section which is composed of a light emitting element such as an organic electroluminescence element and an electronic apparatus provided with the electro-optical device.

An organic EL device has attracted attention as a key device for realizing a display device that exceeds performance of a flat panel display device such as a conventional liquid crystal display device. As an example of such an organic EL device, the one configured with a substrate provided with an organic EL element (hereinafter referred to as a "first substrate") and a substrate provided with a driving circuit to control light emission of the organic EL element (hereinafter referred to as a "second substrate") disposed so as to face each other, and the first substrate and the second substrate electrically connected by a conductive connector is widely known. JP-A-11-3048 is an example of it.

In the above-described organic EL device with such a configuration, it is usually necessary to provide the conductive connector to every predetermined unit such as the organic EL element, so that a number of conductive materials are provided between the first substrate and the second substrate. Therefore, a technology which can avoid short-circuiting between the adjacent conductive connectors with more certainty is sought-after. With a demand for higher-resolution of the display device in recent years, this is becoming increasingly prominent. Also, such a technical problem is not limited to the organic EL device, but it is common to the electro-optical device which is provided with a similar configuration.

SUMMARY

An advantage of the present invention is to provide a technology which can avoid short-circuiting between adjacent conductive connectors with more certainty in accordance with an electro-optical device which is provided with a plurality of conductive connectors between two substrates.

An electro-optical device according to a first aspect of the present invention provided with a plurality of pixel sections, includes: a first substrate having a plurality of light-emitting elements to configure the plurality of pixel sections; a second substrate having a driving circuit to control light emission of the plurality of light-emitting elements, respectively, and disposed so as to face an element-forming surface of the first substrate; a plurality of conductive connectors provided between the first substrate and the second substrate, and electrically connect the plurality of light-emitting elements, respectively, to the driving circuit; and the plurality of conductive connectors at least disposed in a staggered manner along a first arrangement direction of the plurality of pixel sections.

Such a structure is capable of avoiding short-circuiting between the conductive connectors with more certainty, as it can ensure a larger gap (mutual distance) between the adjacent conductive connectors.

It is preferable that the plurality of pixel sections are disposed in a staggered manner along the first arrangement direction, and the plurality of conductive connectors are disposed in a one-to-one correspondence with the plurality of pixel sections, respectively.

Thus, a structure that each conductive connector being disposed in a staggered manner can easily be realized.

Further, in the above case, it is preferable that the plurality of conductive connectors be disposed approximately in the center of the plurality of pixel sections, respectively.

Thus, it can avoid the conductive connectors penetrating into other adjacent pixel sections to minimal, in case the conductive connectors are formed by using a material having fluidity before curing.

Furthermore, it is preferable that the plurality of pixel sections are disposed linearly to the first arrangement direction and a second arrangement direction which is perpendicular to the first arrangement direction, respectively, and the plurality of conductive connectors are disposed in the one-to-one correspondence with the plurality of pixel sections, respectively, and also disposed in a staggered manner along the first arrangement direction.

Such a configuration is also capable of realizing the structure that each conductive connector is disposed in a staggered manner.

It is preferable that the conductive connector is to be formed by curing a conductive material in paste form, respectively.

Thus, even if the conductive material is being expanded while curing the conductive material in paste form by thermocompression bonding and the like, penetration into other adjacent pixel section can be avoided to minimal.

It is preferable that the plurality of light-emitting elements be organic electroluminescence elements, respectively.

Thus, an excellent organic EL device which is capable of avoiding insulation failure can be obtained.

An electronic apparatus according to a second aspect of the present invention includes the electro-optical device in accordance with the first aspect of the invention. The "electronic apparatus" in this case is an apparatus in general provided with an electrical circuit, a display portion and the like, and referred to the one which the display portion is being configured by using the electro-optical device in accordance with the invention. Such electronic apparatuses include, for example, IC cards, cellular phones, video cameras, personal computers, head mount displays, television systems, facsimiles, digital still cameras, PDAs, electronic notebooks and the like.

By providing the electro-optical device in accordance with the present invention, a high-quality electronic apparatus can be obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the present invention will now be described below with reference to the drawings. In the following explanation, an organic EL device is to be explained as an example of an electro-optical device.

Figure 1:
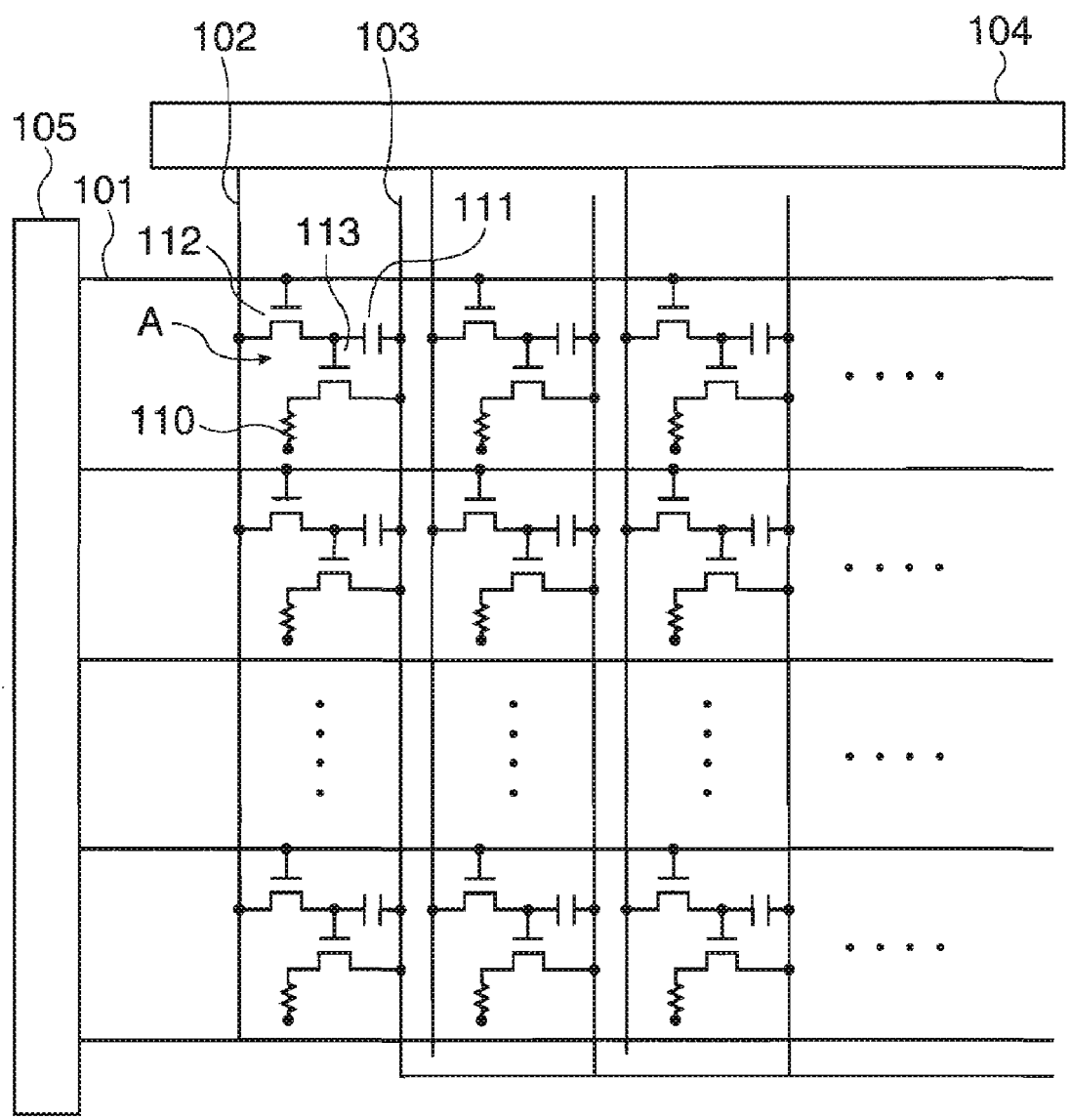
FIG. 1 is a schematic plan view showing a wiring structure of an organic EL device.

FIG. 1 is a schematic plan view showing a wiring structure of the organic EL device. An organic EL device 100 shown in FIG. 1 is configured to include a plurality of scanning lines 101, a plurality of signal lines 102 which are disposed perpendicular to the scanning lines, a plurality of power lines 103 extending in parallel with the signal lines 102, and a pixel section A which is provided near an intersection of each scanning line 101 and each signal line 102, respectively That is, the organic EL device 100 in this case is an active matrix type display device provided with a plurality of pixel sections, and each pixel section is being disposed in a matrix.

Each scanning line 101 is connected to a scanning line driving circuit 105 which is provided with a shift register and a level shifter. Also, each signal line is connected to a data line driving circuit 104 which is provided with a shift register, a level shifter, a video line, and an analog switch. Each pixel section A is provided with a switching transistor 112 which scanning signals are supplied to a gate via the scanning line 101, a storage capacitor 111 which holds the pixel signals supplied from the signal line 102 via the switching transistor 112, a drive transistor 113 which supplies the pixel signals held by the storage capacitor 111 to the gate, a pixel electrode (cathode) which a drive current flows into from the power line 103 when the power line 103 is electrically connected via the drive transistor 113, and a functional layer 110 which is sandwiched between the pixel electrode and a counter electrode (anode). A light-emitting element (organic EL element) is configured with the pixel electrode, the counter electrode, and the functional layer 110. Meanwhile, the functional layer 110 is made of a hole transport layer, a light-emitting layer, an electron-injection layer and the like. In the organic EL device 100, when the scanning line 101 is activated to turn the switching transistor 112 in on-state, a potential of the signal line 102 at the time is to be held in the storage capacitor 111, and the on/off state of the drive transistor 113 is determined by the state of the storage capacitor 111. Thus the current flows into the pixel electrode from the power line 103 via a channel of the drive transistor 113, and furthermore, the current flows into the anode via the functional layer 110. The functional layer 110 emits light according to the amount of current flowing through. By controlling the light-emitting state of each functional layer 110, a desired image can be displayed.

Figure 2:
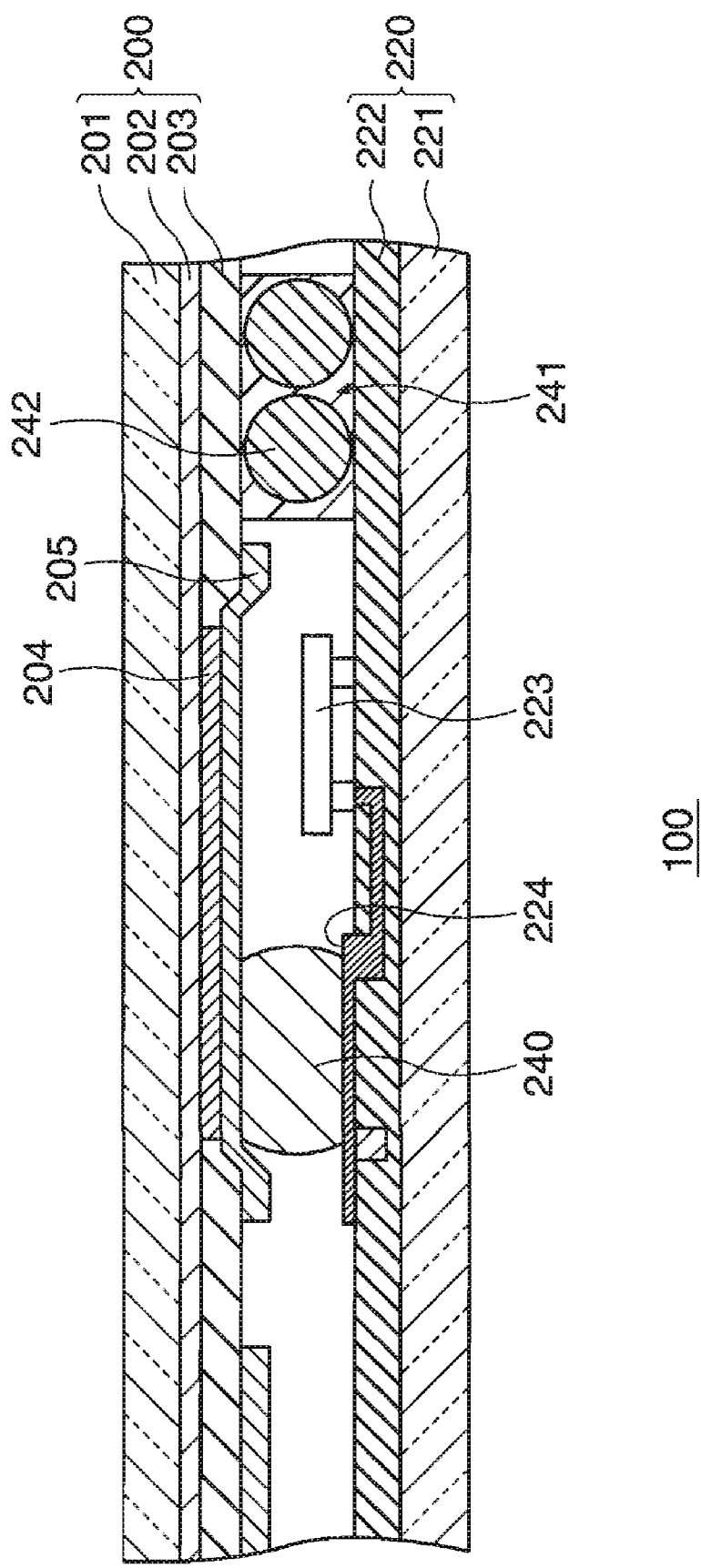
FIG. 2 is a cross-section illustrating a structure of a pixel section of the organic EL, device.

FIG. 2 is a cross-section illustrating a structure of the pixel section A of the organic EL device 100. Meanwhile, FIG. 2 is showing a cross-section which corresponds to the direction of lines II-II shown in FIG. 3, which will hereinafter be described. As shown in FIG. 2, the organic EL device 100 of the present embodiment is configured so that an OLED substrate (first substrate) 200 which has a plurality of organic EL elements to configure the above-described pixel section A, and a wiring substrate (second substrate) 220 which has a driving circuit, wiring and the like to control the light emission of each organic EL element are disposed so as to face each other.

The OLED substrate 200 is configured to include a transparent substrate 201 such as a glass substrate or a flexible substrate, an anode 202 which is made of a transparent conductive film such as ITO and formed on the transparent substrate 201, a baffle 203 which has an opening portion formed at the surface of the anode 202 by using an insulator such as polyimide, an organic layer 204 which is formed at the surface of the anode 202 and within the opening portion of the baffle 203, and a cathode 205 which is made of a conductive film such as aluminum and formed at the surface of the organic layer 204. The organic layer 204 has a structure that, for example, the hole transport layer, the light-emitting layer, an electron transport layer and the like are laminated. The hole transport layer is formed by, for example, a mixture of polyethylene dioxythiophene and polystyrenesulfonic acid (PEDOT/PSS) and the like. The light-emitting layer is formed by, for example, polydialkylfluorene derivatives and the like. The electron transport layer is formed by, for example, calcium, lithium, these oxides, fluorides and the like. The organic EL element is configured to include the anode 202, the organic layer 204, and the cathode 205. And by supplying current to the organic layer 204 via the anode 202 and the cathode 205, the organic layer 204 emits light, and the emitted light is to be emitted externally via the anode 202 and the transparent substrate 201.

The wiring substrate 220 is configured to include a substrate 221 which is made of the glass substrate, the flexible substrate, or the like, an insulating layer 222 which is formed on the substrate 221, a circuit chip 223 which is mounted on the predetermined position on the insulating layer 222, and a wiring 224 which is formed within the insulating layer 222 and a part of it being exposed to the surface. The circuit chip 223 includes a thin-film transistor (TFT) and other circuit elements which are used to drive the organic EL element mounted on the OLED substrate 200.

The FILED substrate 200 and the wiring substrate 220 are firmly fixed to each other with a conductive adhesive (conductive connector) 240 and an insulating adhesive 241. The insulating adhesive 241 includes a spacer 242 in a spherical shape. A gap between the OLED substrate 200 and the wiring substrate 220 is uniformly maintained by the spacer 242. The conductive adhesive 240 comes in contact with the cathode 205 and the wiring 224, and it serves a function of electrically connecting the organic EL element of the OLED substrate 200 side and the circuit chip 223 of the wiring substrate 220 side. And, for example, it is formed by including conductive particles such as carbon particles, silver particles, copper particles and the like dispersed in an epoxy-type or a phenol-type thermosetting adhesive. More specifically, the state of the conductive adhesive 240 before curing is in paste form, and it is coated to the predetermined position on the OLED substrate 200 or the wiring substrate 220 by methods such as screen printing, offset printing, and dispenser coating, and afterwards cured by a method such as thermocompression bonding. The insulating adhesive 241 is an adhesive which has approximately the same characteristics as the conductive adhesive 240 (excluding that conductive fine particles are included), and it is provided between the OLED substrate 200 and the wiring substrate 220, accordingly.

Figure 3:
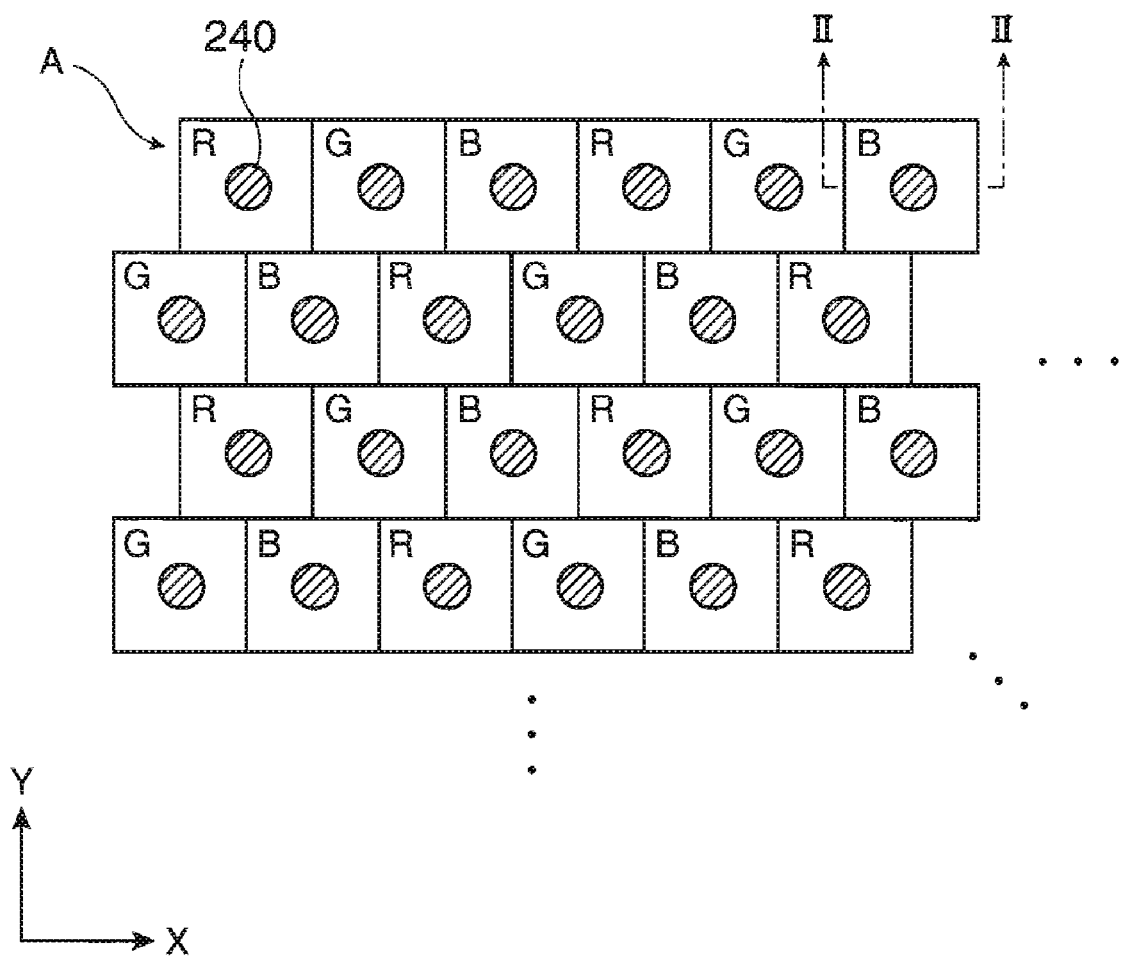
FIG. 3 is a schematic plan view illustrating an arrangement of the pixel section in accordance with the organic EL device.

FIG. 3 is a schematic plan view illustrating an arrangement of the pixel section in accordance with the above-described organic EL device. Meanwhile, "R", "G", and "B" in the figure show that each pixel section A is a pixel corresponding to red, green, or blue. As shown in FIG. 3, each pixel section A is disposed in a staggered manner along the first arrangement direction (X direction in this case). More specifically, focusing on the top and the second rows of the pixels, these pixel rows are shifted by about a half of a pixel from one another. The same applies for other pixel rows, and adjacent pixel rows are shifted by a half pitch of a pixel from one another. Such a pixel arrangement may be referred to as a delta arrangement. And each conductive adhesive 240 is disposed in a one-to-one correspondence with each pixel section A, respectively Accordingly, each conductive adhesive 240 is, as shown in the figure, disposed in a staggered manner along the first arrangement direction (X direction). Further, each conductive adhesive 240 is, as shown in the figure, disposed approximately in the center of each pixel section A, respectively. Thus, even if the conductive adhesive 240 is pushed to expand while curing the conductive adhesive 240 by thermocompression bonding, penetration into other adjacent pixel section A can be avoided with more certainty.

Figure 4:
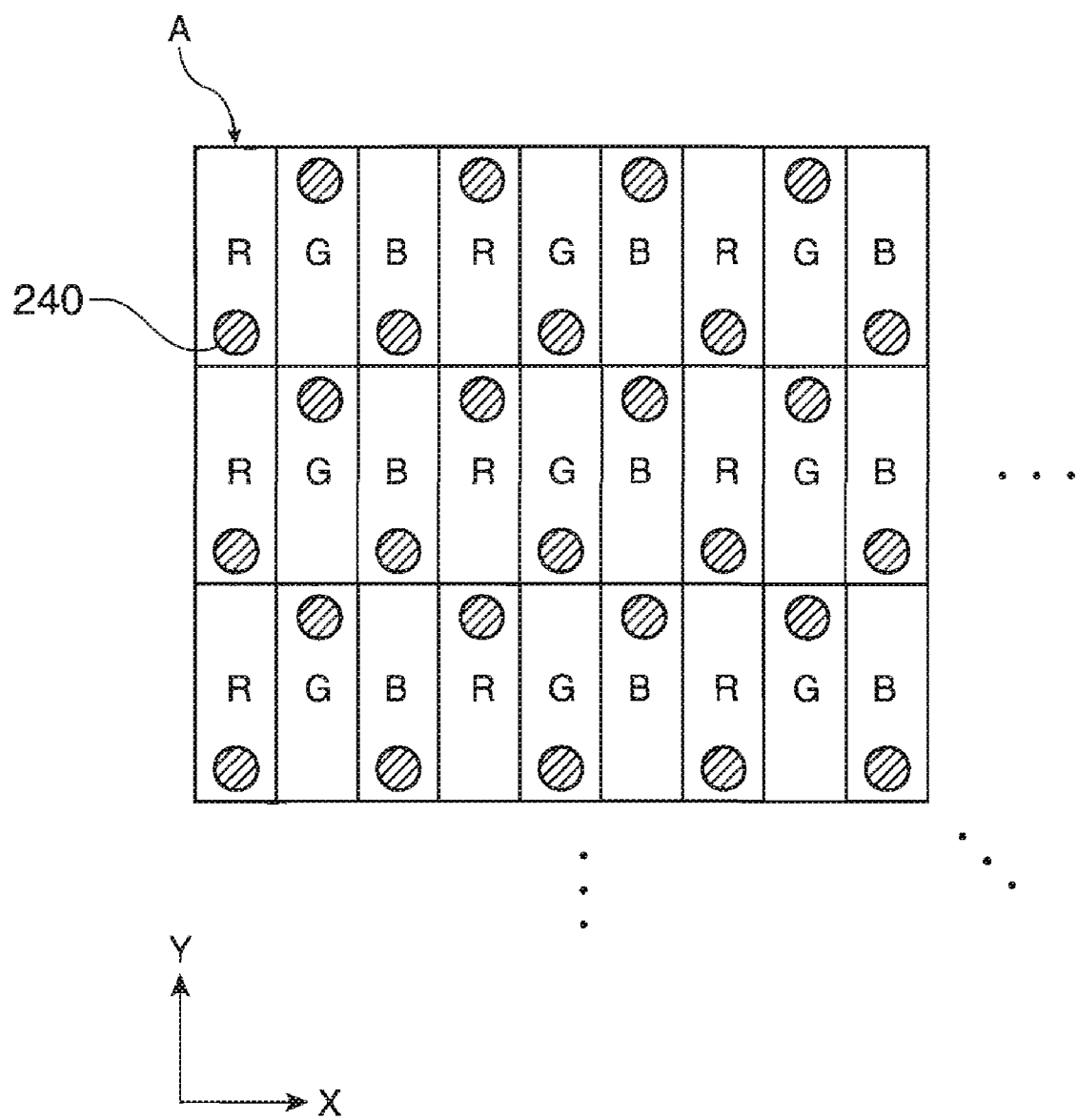
FIG. 4 is a schematic plan view illustrating the other example of the arrangement of the pixel section in accordance with the organic EL device.

FIG. 4 is a schematic plan view illustrating the other example of the arrangement of the pixel section in accordance with the organic EL device. Meanwhile, as the cross sectional structure of the pixel section in this case is the same as the one shown in above-described FIG. 2, the explanation will be omitted here. As shown in FIG. 4, each pixel section A is disposed linearly (in other words, in matrix) to the first arrangement direction (X direction) and a second arrangement direction which is perpendicular to the first arrangement direction (Y direction), respectively. Further, each conductive adhesive 240 is disposed in the one-to-one correspondence with each pixel section A, respectively. Furthermore, each conductive adhesive 240 is disposed alternately, as shown in the figure, so that the mutual distance between the one which is included in other adjacent pixel A will not be too close. More specifically, when the conductive adhesive 240 is disposed in one end in accordance with one pixel section A (in the figure, for example, the bottom side), the conductive adhesive 240 in accordance with other adjacent pixel section A along the first arrangement direction is disposed in the other end (in the figure, for example, the top side). By repeating such a relative positioning, as in the figure, the conductive adhesive 240 is to be disposed in a staggered manner along the first arrangement direction.

Next, specific examples of electronic apparatuses provided with the above-described organic EL device 100 are to be explained.

Figure 5A:
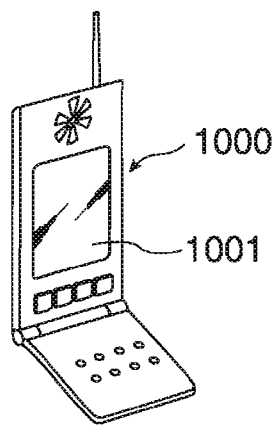
FIGS. 5A through 5C are perspective views showing specific examples of electronic apparatuses provided with the organic EL device.
Figure 5B:
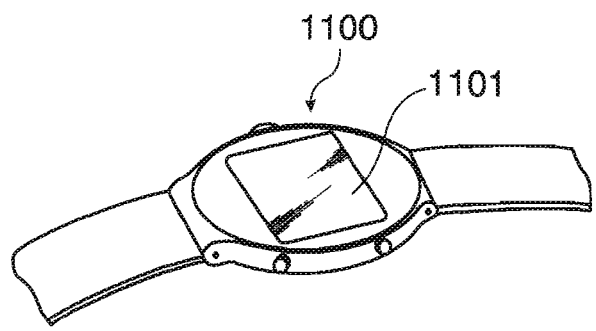
Figure 5C:
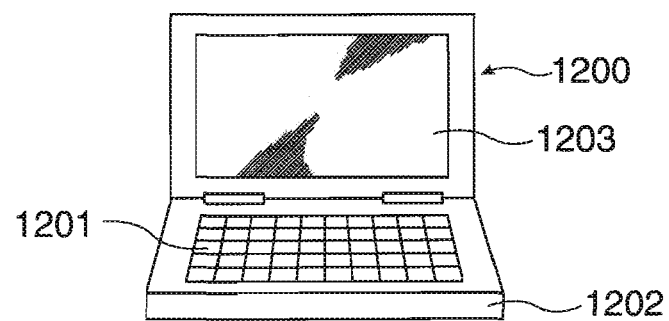

FIGS. 5A through 5C are perspective views showing specific examples of electronic apparatuses provided with the organic EL device 100. FIG. 5A is a perspective view showing a cell-phone as an example of the electronic apparatus. The cell-phone 1000 is provided with a display portion 1001 which is configured by using the organic EL device 100 in accordance with the present embodiment. FIG. 5B is a perspective view showing a wrist watch as an example of the electronic apparatus. The wrist watch 1100 is provided with a display portion 1101 which is configured by using the organic EL device 100 in accordance with the present embodiment. FIG. 5C is a perspective view showing a portable information processing apparatus 1200 as an example of the electronic apparatus. The portable information processing apparatus 1200 is provided with an input part 1201 such as a keyboard, a main body part 1202 which operation means, memory means and the like are stored therein, and a display portion 1203 which is configured by using the organic EL device 100 in accordance with the present embodiment.

Thus, according to the present embodiment, as it can ensure a larger mutual distance between the adjacent conductive adhesives (conductive connectors), it is capable of avoiding short-circuiting between the conductive adhesives with more certainty.

Meanwhile, the present invention is not limited to the above-described embodiments, but various modifications are possible within the scope of the invention. For example, in the above-described embodiment, the conductive adhesive of which the state before curing is in paste form was described as an example of the conductive connector, but the conductive connector may be an electrode (bump) and the like formed in a projection shape by using a conductive material such as solder.

Further, in the above-described embodiment, the organic EL device which is configured to provide the conductive connector to each RGB color pixel was described, but the present invention may apply to the organic EL device which is configured so as to provide the conductive connector to every one pixel, which is configured so that each RGB color pixel is collected together.

Furthermore, in the above-described embodiment, the organic EL device was described as an example of the electro-optical device, but the present invention may apply to various electro-optical devices having a similar structure, in other words, the structure that two substrates are bonded together via the conductive connector.

What is claimed is:

1. An electro-optical device provided with a plurality of pixel sections, comprising:
    a first substrate having a plurality of light-emitting elements to configure the plurality of pixel sections, the plurality of pixel sections being arranged in a staggered manner in adjacent rows in a first arrangement direction such that the pixel sections in adjacent rows are shifted by about a half of a pixel section;
    a second substrate having a driving circuit to control light emission of the plurality of light-emitting elements, respectively, and disposed so as to face an element forming surface of the first substrate; and
    a plurality of conductive connectors provided between the first substrate and the second substrate, and electrically connect the plurality of light-emitting elements, respectively, to the driving circuit, wherein
    the plurality of conductive connectors are disposed in the staggered manner at least along the first arrangement direction of the plurality of pixel sections, the staggered manner of the plurality of conductive members being staggered when the plurality of pixel sections are viewed from a surface of the first substrate.

2. The electro-optical device according to claim 1, wherein the plurality of conductive connectors are disposed in a one-to-one correspondence with the plurality of pixel sections, respectively.

3. The electro-optical device according to claim 2, wherein the plurality of conductive connectors are disposed approximately in a center of the plurality of pixel sections, respectively.

4. The electro-optical device according to claim 1, wherein the plurality of pixel sections are disposed linearly to the first arrangement direction and a second arrangement direction perpendicular to the first arrangement direction, respectively, and
    the plurality of conductive connectors are in the one-to-one correspondence with the plurality of pixel sections, respectively, and also disposed in the staggered manner along the first arrangement direction.

5. The electro-optical device according to claim 1, wherein the plurality of conductive connectors are formed by curing a conductive material in paste form, respectively.

6. The electro-optical device according to claim 1, wherein the plurality of light-emitting elements are an organic electroluminescence element, respectively.

7. An electronic apparatus comprising the electro-optical device according to claim 1.

* * * * *